US011309199B2

(12) United States Patent
Horiuchi et al.

(10) Patent No.: US 11,309,199 B2
(45) Date of Patent: Apr. 19, 2022

(54) SUBSTRATE TRANSFER APPARATUS AND SUBSTRATE TRANSFER METHOD

(71) Applicant: TOKYO ELECTRON LIMITED, Tokyo (JP)

(72) Inventors: Keita Horiuchi, Nirasaki (JP); Koji Maeda, Nirasaki (JP); Morihiro Takanashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/919,888

(22) Filed: Jul. 2, 2020

(65) Prior Publication Data
US 2021/0005486 A1    Jan. 7, 2021

(30) Foreign Application Priority Data

Jul. 5, 2019   (JP) .............................. JP2019-126173

(51) Int. Cl.
  *H01L 21/67*    (2006.01)
  *B65G 47/90*    (2006.01)
  *H01L 21/687*   (2006.01)

(52) U.S. Cl.
  CPC ........ *H01L 21/67201* (2013.01); *B65G 47/90* (2013.01); *H01L 21/67184* (2013.01); *H01L 21/68707* (2013.01)

(58) Field of Classification Search
  None
  See application file for complete search history.

(56) References Cited

U.S. PATENT DOCUMENTS

| 10,043,693 B1* | 8/2018 | Kim ................... H01L 21/67769 |
| 2013/0026135 A1* | 1/2013 | Kim ................... H01L 21/67109 |
| | | 216/58 |
| 2014/0263165 A1 | 9/2014 | Hongkham et al. |

FOREIGN PATENT DOCUMENTS

| JP | 2001-319842 A | 11/2001 |
| JP | 2017-500755 A | 1/2017 |
| KR | 10-2008-0008411 A | 1/2008 |
| WO | WO 2015/066624 A1 | 5/2015 |

* cited by examiner

*Primary Examiner* — Ronald P Jarrett
(74) *Attorney, Agent, or Firm* — Fenwick & West LLP

(57) ABSTRACT

A substrate transfer apparatus for transferring a substrate includes a plurality of vacuum transfer chambers, each having therein a substrate transfer mechanism for holding and transferring the substrate, and an intermediate chamber disposed between the vacuum transfer chambers adjacent to each other. When one of the vacuum transfer chambers adjacent to each other is set as a first vacuum transfer chamber and the other is set as a second vacuum transfer chamber, a first substrate loading/unloading port is disposed between the intermediate chamber and the first vacuum transfer chamber and a second substrate loading/unloading port is disposed between the intermediate chamber and the second vacuum transfer chamber. A gate valve is provided only for the second substrate loading/unloading port. Further, the first and the second substrate loading/unloading port have different height positions.

5 Claims, 5 Drawing Sheets

# SUBSTRATE TRANSFER APPARATUS AND SUBSTRATE TRANSFER METHOD

CROSS-REFERENCE TO RELATED APPLICATIONS

This application claims priority to Japanese Patent Application No. 2019-126173, filed on Jul. 5, 2019, the entire contents of which are incorporated herein by reference.

TECHNICAL FIELD

The present disclosure relates to a substrate transfer apparatus and a substrate transfer method.

BACKGROUND

Japanese Patent Application Publication No. 2001-319842 discloses a multi-cluster tool including four processing chambers each for, e.g., a physical vapor deposition (PVD) process. In this multi-cluster tool, a first transfer space and a second transfer space, each having a robotic wafer transfer mechanism, are connected through a pre-clean chamber. The pre-clean chamber also serves as a pass-through chamber through which a wafer is transferred between the first transfer space and the second transfer space.

The technique of the present disclosure is provided to scale down a substrate transfer apparatus in which multiple vacuum transfer chambers are connected through an intermediate chamber.

SUMMARY

In accordance with an aspect of the present disclosure, there is provided a substrate transfer apparatus for transferring a substrate, including: a plurality of vacuum transfer chambers, each having therein a substrate transfer mechanism for holding and transferring the substrate; and an intermediate chamber disposed between the vacuum transfer chambers adjacent to each other. When one of the vacuum transfer chambers adjacent to each other is set as a first vacuum transfer chamber and the other is set as a second vacuum transfer chamber, a first substrate loading/unloading port is disposed between the intermediate chamber and the first vacuum transfer chamber and a second substrate loading/unloading port is disposed between the intermediate chamber and the second vacuum transfer chamber. Further, a gate valve is provided for the second substrate loading/unloading port between the first substrate loading/unloading port and the second substrate loading/unloading port, and the first substrate loading/unloading port and the second substrate loading/unloading port have different height positions.

BRIEF DESCRIPTION OF THE DRAWINGS

The objects and features of the present disclosure will become apparent from the following description of embodiments, given in conjunction with the accompanying drawings, in which.

DETAILED DESCRIPTION

Figure 1:
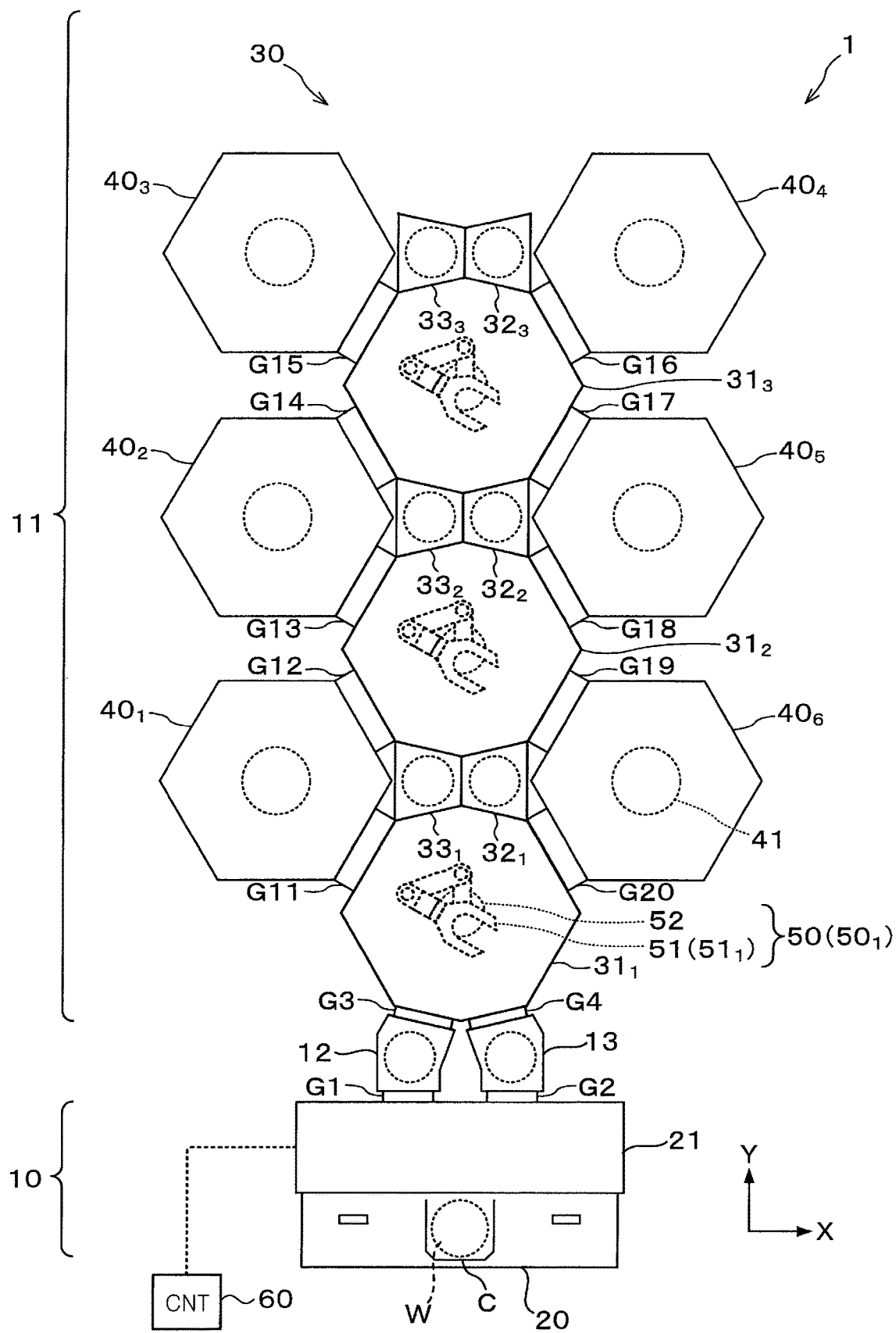
FIG. 1 is a schematic plan view showing an example of a processing system including a vacuum transfer apparatus as a substrate transfer apparatus according to an embodiment.

In a semiconductor device manufacturing process, various processes such as film formation and the like are performed on a semiconductor wafer (hereinafter, referred to as "wafer") in individual vacuum processing chambers. The film formation and the like are performed on one wafer multiple times, if necessary. Therefore, there is suggested a processing system capable of consecutively performing various processes on a wafer without exposing the wafer to the atmosphere by connecting vacuum processing chambers for performing the same process or different processes through a common vacuum transfer apparatus in order to improve a throughput or the like. The vacuum transfer apparatus is an apparatus that transfers the wafer in a vacuum atmosphere.

In the above-described processing system, an apparatus in which multiple vacuum transfer chambers, each having a transfer mechanism for holding and transferring a wafer, are connected through an intermediate chamber may be used as the vacuum transfer apparatus. For example, in the multi-cluster tool disclosed in Japanese Patent Application Publication No. 2001-319842, the first transfer space and the second transfer space, each having the robotic wafer transfer mechanism, are connected through the pre-clean chamber serving as the pass-through chamber.

Further, in the conventional vacuum transfer apparatus in which the multiple vacuum transfer chambers are connected through the intermediate chamber as described above, gate valves are disposed at both ends of the intermediate chamber in a direction that the vacuum transfer chambers are connected.

Due to the presence of the intermediate chamber in the vacuum transfer apparatus, the wafer W can be transferred between the transfer chambers without passing through the vacuum processing chamber. However, the footprint of the vacuum transfer apparatus increases, which leads to an increase in the footprint of the processing system including the vacuum transfer apparatus.

Therefore, the technique of the present disclosure is provided to scale down a substrate transfer apparatus in which multiple vacuum transfer chambers are connected through an intermediate chamber.

Hereinafter, a configuration of a substrate transfer apparatus according to an embodiment will be described in detail with reference to the accompanying drawings. In the specification, like reference numerals will be given to like parts having substantially the same functions and redundant description thereof will be omitted.

FIG. 1 is a schematic plan view showing an example of a processing system including a vacuum transfer apparatus as a substrate transfer apparatus of the present embodiment. Hereinafter, the case where a processing system 1 is used for manufacturing a magnetoresistive element and includes vacuum processing chambers each performing a predetermined process, e.g., film formation, on a wafer W as a substrate will be described.

The processing system 1 has a configuration in which a cassette station 10 for loading and unloading a cassette C capable of accommodating a plurality of wafers W and a processing station 11 including multiple processing modules each performing film formation on the wafers W are integrally connected. The cassette station 10 and the processing station 11 are connected through two load-lock chambers 12 and 13. The load-lock chambers 12 and 13 connect a vacuum transfer apparatus 30 and an atmospheric pressure transfer apparatus 21 to be described later. An inner atmosphere of each of the load-lock chambers 12 and 13 can be switched between an atmospheric pressure state and a vacuum state.

The cassette station 10 includes a cassette mounting table 20 and the atmospheric pressure transfer apparatus 21. The cassette station 10 may further include an orienter (not shown) for adjusting the orientation of the wafer W.

The cassette mounting table 20 is disposed at one end of the processing system 1 on the negative side of the Y direction (bottom side in FIG. 1) of the processing system 1. A plurality of, e.g., three cassettes C can be mounted on the cassette mounting table 20.

The atmospheric pressure transfer apparatus 21 transfers the wafer W into an atmospheric pressure state by a wafer transfer mechanism (not shown). The wafer transfer mechanism includes a transfer arm for holding the wafer W substantially horizontally. The transfer arm is configured to be rotatable, extensible and contractible in a horizontal direction and movable in a vertical direction. Further, the wafer transfer mechanism is configured to transfer the wafer W while holding the wafer W by the transfer arm.

Further, the load-lock chambers 12 and 13 are connected to the atmospheric pressure transfer apparatus 21 on the positive side of the Y direction (upper side in FIG. 1) of the atmospheric pressure transfer apparatus 21 through gate valves G1 and G2. Further, the vacuum transfer apparatus 30 of the processing station 11, specifically, a vacuum transfer chamber $31_1$ to be described later is connected to the load-lock chambers 12 and 13 on the positive side of the Y direction of the load-lock chambers 12 and 13 through gate valves G3 and G4.

The processing station 11 includes the vacuum transfer apparatus 30 and a plurality (six in this example) of vacuum processing chambers $40_1$ to $40_6$ (hereinafter, may be collectively referred to as "vacuum processing chamber 40"). The inner atmosphere of each of the vacuum transfer apparatus 30 and the vacuum processing chamber 40 are maintained in an atmosphere (vacuum atmosphere) lower than the atmospheric pressure during a series of processes performed on the wafer W in the processing system 1.

The vacuum transfer apparatus 30 includes a plurality (three in this example) of vacuum transfer chambers $31_1$ to $31_3$ (hereinafter, may be collectively referred to as "vacuum transfer chamber 31") connected through intermediate chambers 32. Further, the vacuum transfer apparatus 30 is formed by integrating the vacuum transfer chambers 31 arranged along the Y direction of FIG. 1, intermediate chambers $32_1$ to $32_3$ (hereinafter, may be collectively referred to as "intermediate chamber 32") arranged between the adjacent vacuum transfer chambers 31, and temperature control chambers $33_1$ to $33_3$ (hereinafter, may be collectively referred to as "temperature control chamber 33"). Each of the vacuum transfer chamber 31, the intermediate chamber 32, and the temperature control chamber 33 has a hermetically sealed housing formed in a substantially polygonal shape in a plan view. The vacuum transfer apparatus 30 has a housing (housing 30a in FIG. 2 to be described later) formed by integrating the hermetically sealed housings.

At the outer side of the negative side of the X direction (left side in FIG. 1) of the vacuum transfer apparatus 30, i.e., the apparatus width direction of the vacuum transfer apparatus 30, the vacuum processing chambers $40_1$ to $40_3$ are arranged along the Y direction (vertical direction in FIG. 1) that is the apparatus depth (front-to-rear) direction and a connecting direction along which the vacuum transfer chambers 31 are connected. The vacuum processing chambers $40_1$ to $40_3$ are connected to the corresponding vacuum transfer chambers 31. Specifically, the vacuum processing chamber $40_1$ is connected to the vacuum transfer chambers $31_1$ and $31_2$ respectively through gate valves G11 and G12; the vacuum processing chamber $40_2$ is connected to the vacuum transfer chambers $31_2$ and $31_3$ respectively through gate valves G13 and G14, respectively; and the vacuum processing chamber $40_3$ is connected to the vacuum transfer chamber $31_3$ through a gate valve G15.

At the outer side of the positive direction of the X direction (right side in FIG. 1) of the vacuum transfer apparatus 30, the vacuum processing chambers $40_4$ to $40_6$ are arranged along the Y direction (vertical direction in FIG. 1) and are connected to the corresponding vacuum transfer chambers 31. Specifically, the vacuum processing chamber $40_4$ is connected to the vacuum transfer chamber $31_3$ through a gate valve G16; the vacuum processing chamber $40_5$ is connected to the vacuum transfer chambers $31_3$ and $31_2$ respectively through gate valves G17 and G18; and the vacuum processing chamber $40_6$ is connected to the vacuum transfer chambers $31_2$ and $31_1$ respectively through gate valves G19 and G20.

Through each of the vacuum transfer chambers 31, the wafer W is extracted from a module adjacent thereto (the vacuum processing chamber 40, the intermediate chamber 32, the temperature control chamber 33, or the load-lock chambers 12 and 13) and is transferred to another module adjacent thereto.

A wafer transfer mechanism 50 for transferring the wafer W is disposed in each of the vacuum transfer chambers 31. The wafer transfer mechanism 50 has a transfer arm 51 for holding the wafer W substantially horizontally. The transfer arm 51 is configured to be rotatable and extensible/contractible in the horizontal direction. Further, the wafer transfer mechanism 50 has an elevating unit 52 disposed below the transfer arm 51. The transfer arm 51 can be vertically moved by the elevating unit 52. The wafer transfer mechanism 50 is configured to transfer the wafer W while holding the wafer W by the transfer arm 51. In the following description, a wafer transfer mechanism $50_n$ and a transfer arm $51_n$ indicate the wafer transfer mechanism 50 and the transfer arm 51 of the wafer transfer mechanism 50 disposed in the vacuum transfer chamber $31_n$ where "n" is a natural number from 1 to 3.

Further, each of the vacuum transfer chambers 31 has an opening (see reference numeral 34 in FIG. 4 to be described later) through which the wafer W is transferred to and from a module (the vacuum processing chamber 40 or the load-lock chambers 12 and 13) disposed at the outer side of the vacuum transfer apparatus 30.

The intermediate chamber 32 serves as, e.g., a relay unit when the wafer W is transferred between the adjacent vacuum transfer chambers 31. The inner spaces of the adjacent vacuum transfer chambers 31 communicate with each other through the inner space of the intermediate chamber 32, so that the wafer W can be transferred between the adjacent vacuum transfer chambers 31.

In this example, the vacuum transfer apparatus 30 has three intermediate chambers $32_1$, $32_2$, and $32_3$, arranged in that order from the negative side (bottom side in FIG. 1) of the Y direction (vertical direction in FIG. 1). The intermediate chamber $32_3$ is not disposed between the vacuum transfer chambers 31 in the configuration of the processing system 1. Since, however, the intermediate chamber $32_3$ has the same configuration as those of the intermediate chambers $32_1$ and $32_2$, the intermediate chamber $32_3$ is also described as an "intermediate chamber" in this specification.

Some or all of the intermediate chambers 32 have a function of controlling the temperature of the wafer W loaded into the intermediate chamber 32 to a room temperature. Specifically, some or all of the intermediate chambers 32 have a function of cooling or heating the temperature of the wafer W loaded into the intermediate chamber 32 to the room temperature. In the following description, only the intermediate chambers $32_2$ and $32_3$ among the intermediate chambers $32_1$ to $32_3$ have the function of controlling the temperature of the wafer W to the room temperature.

The specific configuration of the intermediate chamber 32 will be described later.

The temperature control chamber 33 is a module for controlling the temperature of the wafer W to a temperature higher or lower than the room temperature. Specifically, the temperature control chamber 33 is a module for performing a high-temperature heating process of heating the wafer W to a desired temperature higher than the room temperature or maintaining the wafer W at the room temperature, or a low-temperature cooling process of cooling the temperature of the wafer W to a desired temperature lower than the room temperature or maintaining the wafer W at the room temperature.

In this example, the vacuum transfer apparatus 30 has three temperature control chambers $33_1$, $33_2$, and $33_3$ disposed along the Y direction (vertical direction in FIG. 1) from the negative side of the Y direction (bottom side in FIG. 1) in that order. In the following description, among the temperature control chambers $33_1$ to $33_3$, the temperature control chambers $33_2$ and $33_3$ perform the high-temperature heating process, and the temperature control chamber $33_1$ performs the low-temperature cooling process.

The specific configuration of the temperature control chamber 33 will be described later.

The temperature control chamber $33_1$ and the intermediate chamber $32_1$ are arranged to be adjacent to each other in the X direction (right-left direction in FIG. 1), i.e., the apparatus width direction. The temperature control chamber $33_2$ and the intermediate chamber $32_2$ are arranged in the same manner. Further, the temperature control chamber $33_3$ and the intermediate chamber $32_3$ are arranged in the same manner.

The vacuum processing chamber 40 performs film formation such as physical vapor deposition (PVD) or the like on the wafer W. A substrate support 41 on which the wafer W is horizontally placed is disposed in the vacuum processing chamber 40. An electrostatic chuck may be disposed on the substrate support 41, if necessary. Further, the substrate support 41 has a flow path for a temperature control medium or a heating plate as a temperature control mechanism (not shown) for controlling a temperature of the wafer W to a desired temperature by controlling a temperature of the substrate support 41 on which the wafer W is placed to a desired temperature.

For example, in the vacuum processing chamber $40_1$, the temperature of the substrate support 41 is controlled to the room temperature and a Ta film is formed as an electrode layer or an under layer. In the vacuum processing chamber $40_2$, the temperature of the substrate support 41 is controlled to a high temperature and a Co film or a Pt film is formed as a fixed layer of a magnetoresistive element. In the vacuum processing chamber $40_3$, the temperature of the substrate support 41 is controlled to a room temperature and a CoFeB film is formed as a reference layer. Further, for example, in the vacuum processing chamber $40_4$, the temperature of the substrate support 41 is controlled to a high temperature and an MgO film is formed as a barrier layer. In the vacuum processing chamber $40_5$, the temperature of the substrate support 41 is controlled to an extremely low temperature and a CoFeB film is formed as a free layer. In the vacuum processing chamber $40_6$, the temperature of the substrate support 41 is controlled to a room temperature and a Ta film or a Ru film is formed as a cap layer or an electrode layer.

The processing system 1 configured as described above includes a controller (CNT) 60. The controller 60 is, e.g., a computer having a CPU, a memory, and the like, and includes a program storage unit (not shown). The program storage unit stores programs and the like for implementing a wafer processing to be described later in the processing system 1. The programs may be stored in a computer-readable storage medium and installed in the controller 60 from the storage medium. Further, a part or all of the programs may be realized by a dedicated hardware (circuit board).

Next, the intermediate chamber 32 and the temperature control chamber 33 will be described in detail.

Figure 2:
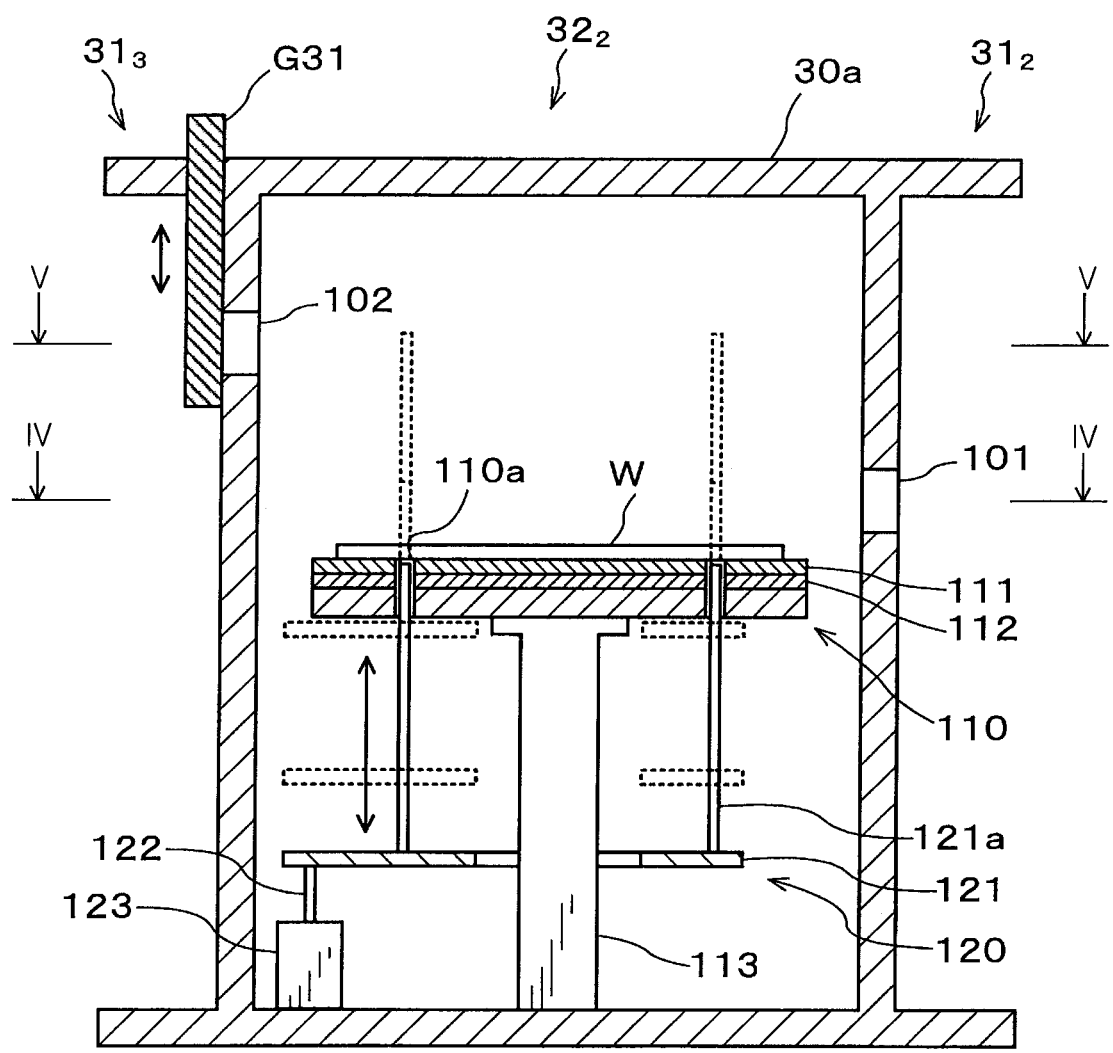
FIG. 2 is a vertical cross-sectional view of an intermediate chamber and neighboring components thereof.
Figure 3:
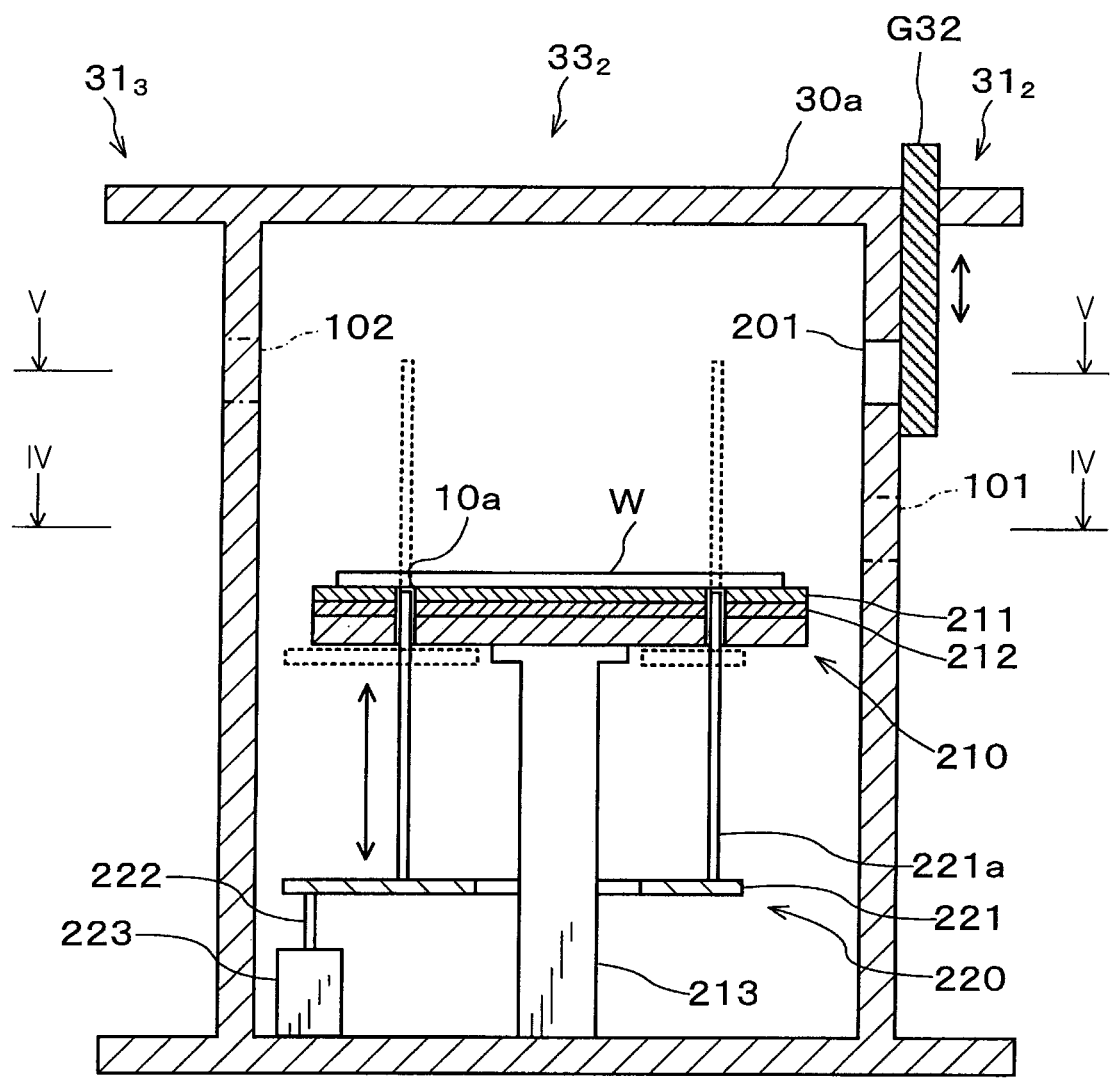
FIG. 3 is a vertical cross-sectional view of a temperature control chamber and neighboring components thereof.
Figure 4:
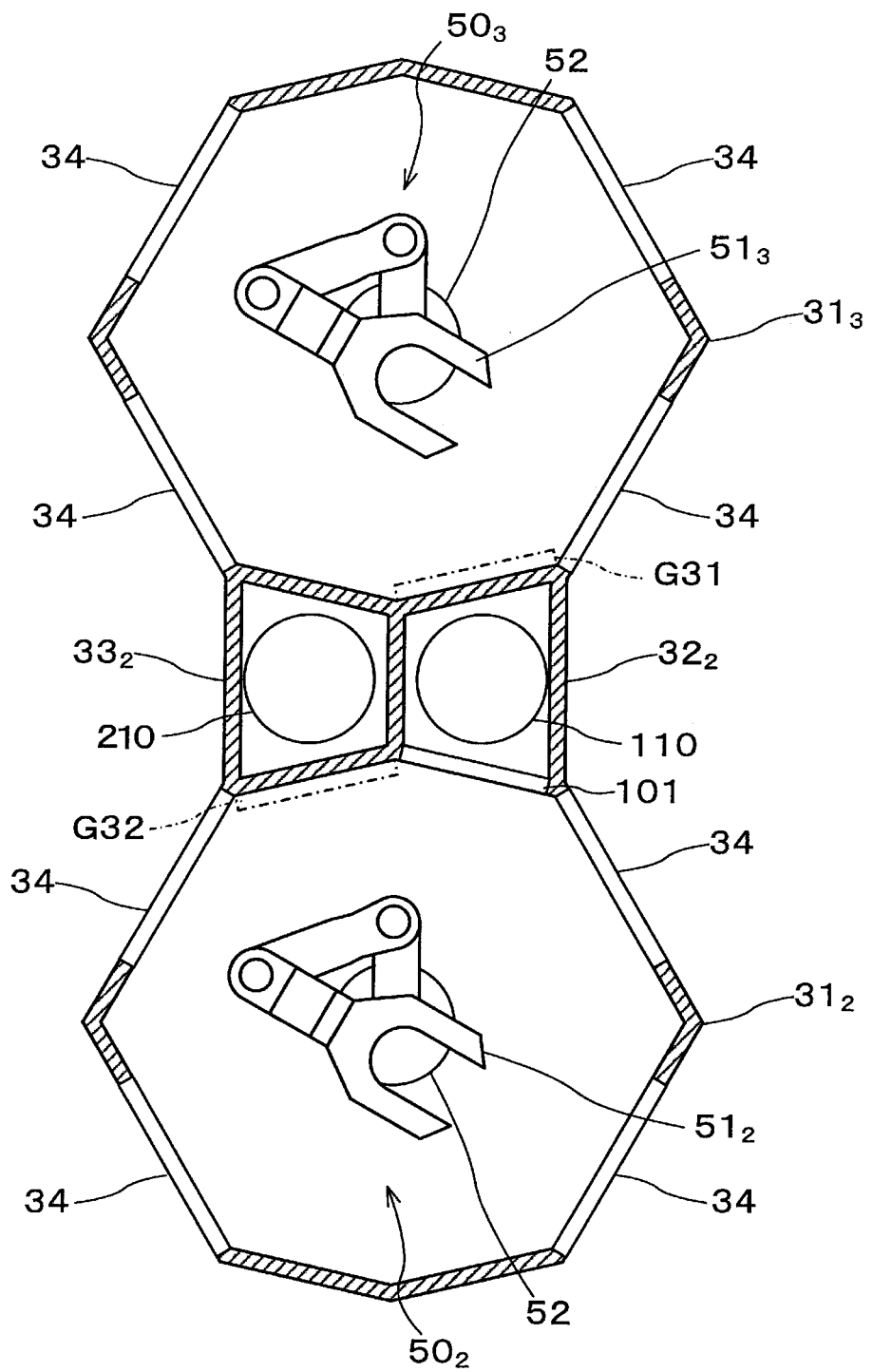
FIG. 4 is a horizontal cross-sectional view of the intermediate chamber, the temperature control chamber and neighboring components thereof, including a cross section taken along a line IV-IV of FIG. 2 and a cross section taken along a line IV-IV of FIG. 3.
Figure 5:
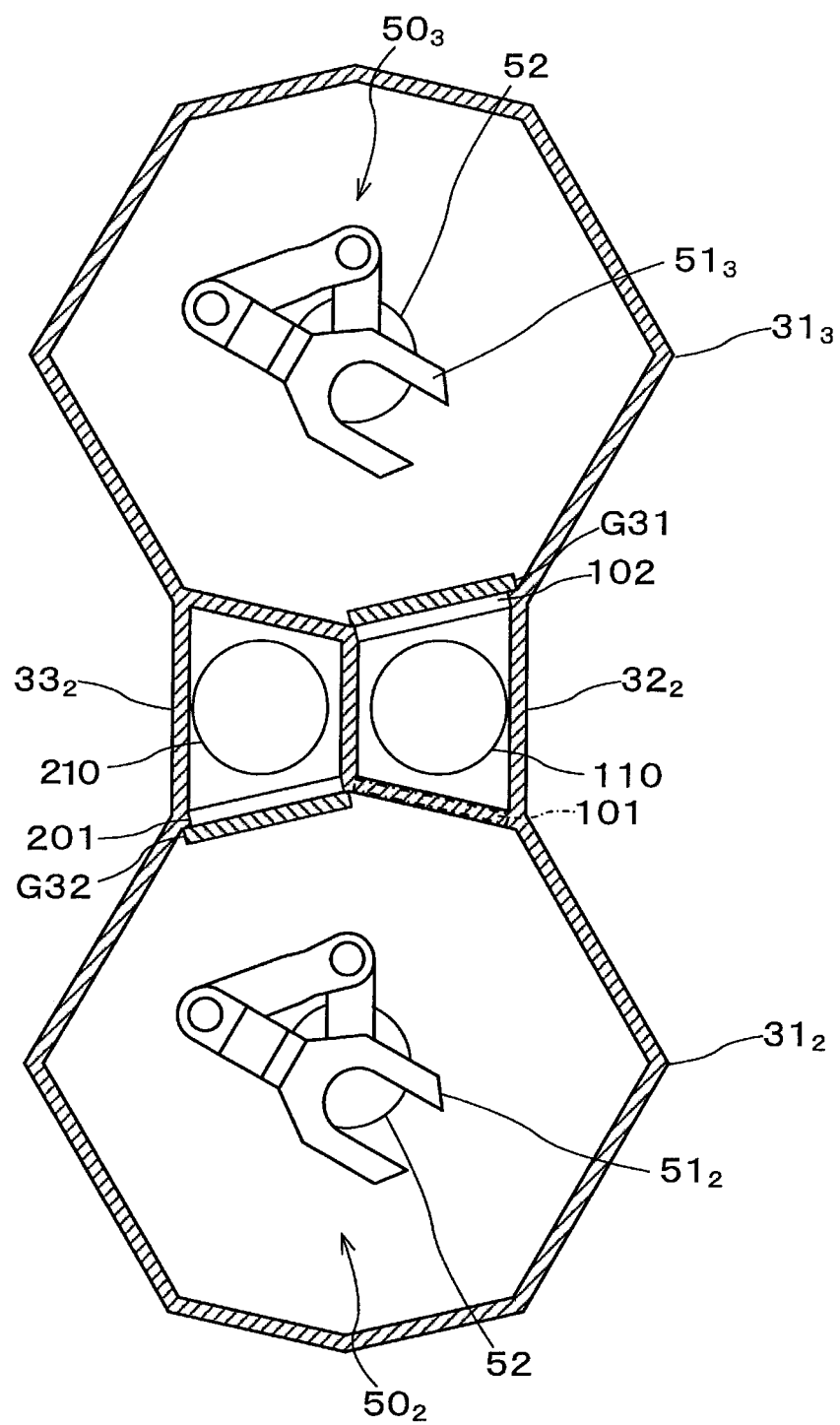
FIG. 5 is a horizontal cross-sectional view of the intermediate chamber, the temperature control chamber and neighboring components thereof, including a cross section taken along a line V-V of FIG. 2 and a cross section taken along a line V-V of FIG. 3.

FIG. 2 is a vertical cross-sectional view of the intermediate chamber $32_2$ shown in FIG. 1 and neighboring components thereof. FIG. 3 is a vertical cross-sectional view of the temperature control chamber $33_2$ and neighboring components thereof. FIG. 4 is a horizontal cross-sectional view of the intermediate chamber $32_2$, the temperature control chamber $33_2$, and neighboring components thereof, including a cross section taken along a line IV-IV of FIG. 2 and a cross section taken along a line IV-IV of FIG. 3. FIG. 5 is a cross-sectional view of the intermediate chamber $32_2$, the temperature control chamber $33_2$, and neighboring components thereof, including a cross section taken along a line V-V of FIG. 2 and a cross section taken along a line V-V of FIG. 3.

As shown in FIG. 2, a first wafer loading/unloading port 101 is disposed between the intermediate chamber $32_2$ and the vacuum transfer chamber $31_2$, and a second wafer loading/unloading port 102 is disposed between the intermediate chamber $32_2$ and the vacuum transfer chamber $31_3$. The inner space of the intermediate chamber $32_2$ and the inner space of the vacuum transfer chamber $31_2$ communicate with each other by the first wafer loading/unloading port 101, and the inner space of the intermediate chamber $32_2$ and the inner space of the vacuum transfer chamber $31_3$ communicate with each other by the second wafer loading/unloading port 102.

A gate valve G31 is disposed only at the second wafer loading/unloading port 102 between the first wafer loading/unloading port 101 and the second wafer loading/unloading port 102.

In other words, the first and second wafer loading/unloading ports 101 and 102 are disposed at both ends of the intermediate chamber $32_2$ in a connecting direction that the vacuum transfer chambers 31 are connected (right-left direction in FIG. 2), but the gate valve G31 is disposed only at the second wafer loading/unloading port 102.

Further, the first wafer loading/unloading port 101 and the second wafer loading/unloading port 102 have different height positions.

A substrate support 110 on which the wafer W is horizontally placed is disposed in the intermediate chamber $32_2$ and has a circular shape in a plan view. An electrostatic chuck 111 is disposed on the substrate support 110. A cooling mechanism 112 for cooling the wafer W to a room temperature is disposed in the substrate support 110. The cooling mechanism 112 is, e.g., a flow path for cooling water.

Further, an upper end of a supporting member 113 extending in the vertical direction is connected to the center of a bottom surface of the substrate support 110. A lower end of the supporting member 113 is connected to a bottom wall of the housing 30a.

A wafer elevating mechanism 120 that is a substrate elevating mechanism is disposed below the substrate support 110 in the intermediate chamber $32_2$. The wafer elevating mechanism 120 includes a wafer elevating member 121, a supporting column 122, and an elevating mechanism 123. A plurality of, e.g., three, supporting pins 121a extending in the vertical direction are disposed on an upper surface of the wafer elevating member 121. The supporting column 122 extends in the vertical direction. An upper end of the supporting column 122 is connected to a bottom surface of the wafer elevating member 121, and a lower end of the supporting column 122 is connected to the elevating mechanism 123. The elevating mechanism 123 drives the wafer elevating member 121 in the vertical direction. As the wafer elevating member 121 is vertically moved by driving the elevating mechanism 123, the supporting pins 121a protrude beyond and retract below an upper surface of the substrate support 110 through through-holes 110a formed in the substrate support 110. Due to the vertical movement of the wafer elevating member 121 and the vertical movement of the supporting pins 121a, the wafer W can be transferred between the supporting pins 121a and the transfer arm 51 of the wafer transfer mechanism 50 inserted from the first wafer loading/unloading port 101 or the second wafer loading/unloading port 102, or between the substrate support 110 and the supporting pins 121a.

As shown in FIG. 3, the vacuum transfer chambers $31_2$ and $31_3$ are disposed adjacent to the temperature control chamber $33_2$, and a third wafer loading/unloading port 201 is disposed only between the temperature control chamber $33_2$ and the vacuum transfer chamber $31_2$ and no wafer loading/unloading port is disposed between the temperature control chamber $33_2$ and the vacuum transfer chamber $31_3$. The inner space of the temperature control chamber $33_2$ and the inner space of the vacuum transfer chamber $31_2$ communicate with each other through the third wafer loading/unloading port 201.

A gate valve G32 is disposed at the third wafer loading/unloading port 201.

The height position of the third wafer loading/unloading port 201 is substantially the same as that of the second wafer loading/unloading port 102 of the intermediate chamber $32_2$ and is different from that of the first wafer loading/unloading port 101 of the intermediate chamber $32_2$.

A substrate support 210 on which the wafer W is horizontally placed is disposed in the temperature control chamber $33_2$ and has a circular shape in a plan view. An electrostatic chuck 211 is disposed on the substrate support 210. A heating mechanism 212 for heating the wafer W to a desired temperature higher than a room temperature or maintaining the wafer W at the room temperature is disposed in the substrate support 210. The heating mechanism 212 may be, e.g., a resistance heater.

Further, an upper end of a supporting member 213 extending in the vertical direction is connected to the center of a bottom surface of the substrate support 210. A lower end of the supporting member 213 is connected to a bottom wall of the housing of the temperature control chamber $33_2$.

A wafer elevating mechanism 220 is disposed below the substrate support 210 in the temperature control chamber $33_2$. The wafer elevating mechanism 220 includes a wafer elevating member 221, a supporting column 222, and an elevating mechanism 223. A plurality of, e.g., three, supporting pins 221a extending in the vertical direction are disposed on an upper surface of the wafer elevating member 221. The supporting column 222 extends in the vertical direction. An upper end of the supporting column 222 is connected to a bottom surface of the wafer elevating member 221, and a lower end of the supporting column 222 is connected to the elevating mechanism 223. The elevating mechanism 223 drives the wafer elevating member 221 in the vertical direction. As the wafer elevating member 221 is vertically moved by driving the elevating mechanism 223, the supporting pins 221a protrude beyond and retract below an upper surface of the substrate support 210 through through-holes 210a formed in the substrate support 210. Due to the vertical movement of the wafer elevating member 221 and the vertical movement of the supporting pins 221a, the wafer W can be transferred between the supporting pins 221a and the transfer arm 51 of the wafer transfer mechanism 50 inserted from the third wafer loading/unloading port 201, or between the substrate support 210 and the supporting pins 221a.

Further, a distance from the center of the substrate support 210 in the temperature control chamber $33_2$ to the rotation center of the wafer transfer mechanism 50 and a distance from the center of the substrate support 110 in the intermediate chamber $32_2$ to the rotation center of the wafer transfer mechanism 50 are smaller than or equal to a distance from the rotation center of the wafer transfer mechanism 50 to the center of the substrate support 41 of the vacuum processing chamber 40. In other words, the substrate support 210 in the temperature control chamber $33_2$ and the substrate support 110 in the intermediate chamber $32_2$ are arranged within a rotation range of the arm of the wafer transfer mechanism 50.

The gate valve G32 provided for the temperature control chamber $33_2$ is not disposed on the plane where the wafer W is transferred with respect to the first wafer loading/unloading port 101. In other words, as shown in FIGS. 3 and 4, the gate valve G32 is not disposed on the same horizontal plane as the first wafer loading/unloading port 101. Specifically, the gate valve G32 is disposed at an upper portion of the vacuum transfer apparatus 30 so as not to be disposed on the same horizontal plane as the first wafer loading/unloading port 101. Therefore, as shown in FIG. 5, even when the gate valve G32 and the first wafer loading/unloading port 101 are partially overlapped with each other in the X direction, i.e., the apparatus width direction in a plan view, the loading/unloading of the wafer W through the first wafer loading/unloading port 101 is not hindered.

As described above, the gate valves G31 and G32 are disposed at the second wafer loading/unloading port 102 and the third wafer loading/unloading port 201, respectively, and no gate valve is disposed at the first wafer loading/unloading port 101. This indicates that, in the intermediate chamber $32_2$ and the temperature control chamber $33_2$, the gate valves G31 and G32 are disposed at different positions in the connecting direction that the vacuum transfer chambers 31 are connected, i.e., in the apparatus depth direction (Y direction) and that the gate valves G31 and G32 are also disposed at different positions in the apparatus width direction (X direction).

Further, the vacuum transfer chamber 31 has multiple openings 34 for connecting the vacuum processing chamber 40 and the load-lock chambers 12 and 13. These openings 34 have the same height position as that of the first wafer loading/unloading port 101. In other words, these openings 34 are disposed on the same horizontal plane as the first wafer loading/unloading port 101. Further, the height positions of the first wafer loading/unloading port 101 and the openings 34 are different from the height positions of the second wafer loading/unloading port 102 and the third wafer loading/unloading port 201. In order to cope with the difference in the height positions, the wafer transfer mechanism 50 in each vacuum transfer chamber 31 has the elevating unit 52 as described above. For example, the wafer W unloaded from the intermediate chamber $32_2$ or the temperature control chamber $33_2$ through the second wafer loading/unloading port 102 or the third wafer loading/unloading port 201 can be moved downward by the elevating unit 52. Accordingly, the wafer W can be loaded into the vacuum processing chamber 40 through the opening 34.

Since the structures of the intermediate chambers $32_1$ and $32_3$ are the same as that of the intermediate chamber $32_2$, and the structures of the temperature control chambers $33_1$ and $33_3$ are the same as that of the temperature control chamber $33_2$, the description thereof will be omitted. However, the substrate support 110 and the supporting member 113 in the intermediate chamber $32_1$ may be omitted, and the second wafer loading/unloading port 102 and the gate valve G31 provided for the intermediate chamber $32_3$ may be omitted. In addition, the temperature control chamber $33_1$ is provided with a cooling mechanism for cooling the wafer W to a desired temperature lower than the room temperature or maintaining the wafer W at the room temperature, instead of the heating mechanism 212. The cooling mechanism is, e.g., a flow path for a coolant having a temperature of 0° C. or lower.

Next, the wafer processing using the processing system 1 configured as described above will be described.

First, the cassette C containing a plurality of wafers W is loaded into the cassette station 10 of the processing system 1 and mounted on the cassette mounting table 20. Then, a wafer transfer mechanism (not shown) of the atmospheric pressure transfer apparatus 21 extracts one wafer W from the cassette C. The gate valve G1 is opened and the wafer W is loaded into the load-lock chamber 12. When the wafer W is loaded into the load-lock chamber 12, the gate valve G1 is closed and the load-lock chamber 12 is sealed and depressurized. Thereafter, the gate valve G3 is opened, and the load-lock chamber 12 and the vacuum transfer chamber $31_1$ maintained in the vacuum atmosphere communicate with each other. Then, the wafer W is unloaded from the load-lock chamber 12 and loaded into the vacuum transfer chamber $31_1$ by a transfer arm $51_1$ of a wafer transfer mechanism $50_1$.

Next, the gate valve G3 is closed and the gate valve G11 is opened, so that the vacuum transfer chamber $31_1$ and the vacuum processing chamber $40_1$ communicate with each other. Then, the wafer W is placed on the substrate support 41 having a room temperature in the vacuum processing chamber $40_1$ by the transfer arm $51_1$ of the wafer transfer mechanism $50_1$ and the wafer elevating mechanism (not shown) in the vacuum processing chamber $40_1$.

A degas chamber (not shown) for heating and degassing the wafer W may be provided in the vacuum transfer chamber $31_1$ so that the degas process can be performed on the wafer W in the degas chamber before the wafer W is loaded into the vacuum processing chamber $40_1$.

After the wafer W is placed on the substrate support 41, the gate valve G11 is closed and the vacuum processing chamber $40_1$ is sealed. Then, film formation is performed on the wafer W in the vacuum processing chamber $40_1$. Accordingly, a Ta film is formed as, e.g., an electrode layer or a base layer, on the wafer W.

When the processing in the vacuum processing chamber $40_1$ is completed, the gate valve G12 is opened, and the vacuum processing chamber $40_1$ and the vacuum transfer chamber $31_2$ communicate with each other. Then, the wafer W is unloaded from the vacuum processing chamber $40_1$ and loaded into the vacuum transfer chamber $31_2$ by a transfer arm $51_2$ of a wafer transfer mechanism $50_2$.

Next, the gate valve G12 is closed and the gate valve G13 is opened so that the vacuum transfer chamber $31_2$ and the vacuum processing chamber $40_2$ communicate with each other. Then, the wafer W is placed on the substrate support 41 in the vacuum processing chamber $40_2$ that has been pre-heated to a high temperature by the transfer arm $51_2$ of the wafer transfer mechanism $50_2$ and the wafer elevating mechanism (not shown) in the vacuum processing chamber $40_2$.

After the wafer W is placed on the substrate support 41, the gate valve G13 is closed and the vacuum processing chamber $40_2$ is sealed. Then, film formation is performed on the wafer W in the vacuum processing chamber $40_2$. Accordingly, a Co film or a Pt film is formed as, e.g., a fixed layer of a magnetoresistive element, on the wafer W.

When the processing in the vacuum processing chamber $40_2$ is completed, the gate valve G14 is opened, and the vacuum processing chamber $40_2$ and the vacuum transfer chamber $31_3$ communicate with each other. Then, the wafer W is unloaded from the vacuum processing chamber $40_2$ and loaded into the vacuum transfer chamber $31_3$ by a transfer arm $51_3$ of a wafer transfer mechanism $50_3$.

Next, the gate valve G14 is closed and the gate valve G15 is opened so that the vacuum transfer chamber $31_3$ and the vacuum processing chamber $40_3$ communicate with each other. Then, the wafer W is placed on the substrate support 41 having a room temperature in the vacuum processing chamber $40_3$ by the transfer arm $51_3$ of the wafer transfer mechanism $50_3$ and the wafer elevating mechanism (not shown) in the vacuum processing chamber $40_3$.

After the wafer W is placed on the substrate support 41, the gate valve G15 is closed and the vacuum processing chamber $40_3$ is sealed. Then, film formation is performed on the wafer W in the vacuum processing chamber $40_3$. Accordingly, a CoFeB film is formed as, e.g., a reference layer, on the wafer W.

When the processing in the vacuum processing chamber $40_3$ is completed, the gate valve G15 is opened and the vacuum processing chamber $40_3$ and the vacuum transfer chamber $31_3$ communicate with each other. Then, the wafer W is unloaded from the vacuum processing chamber $40_3$ and loaded into the vacuum transfer chamber $31_3$ by the transfer arm $51_3$ of the wafer transfer mechanism $50_3$.

Next, the gate valve G15 is closed and the gate valve G16 is opened so that the vacuum transfer chamber $31_3$ and the vacuum processing chamber $40_4$ communicate with each other. Then, the wafer W is placed on the substrate support 41 in the vacuum processing chamber $40_4$ that has been pre-heated to a high temperature by the transfer arm $51_3$ of the wafer transfer mechanism $50_3$ and the wafer elevating mechanism (not shown) in the vacuum processing chamber $40_4$.

After the wafer W is placed on the substrate support 41, the gate valve G16 is closed and the vacuum processing chamber $40_4$ is sealed. Then, film formation is performed on the wafer W in the vacuum processing chamber $40_4$. Accordingly, an MgO film is formed as, e.g., a barrier layer, on the wafer W.

When the processing in the vacuum processing chamber $40_4$ is completed, the gate valve G16 is opened, and the vacuum processing chamber $40_4$ and the vacuum transfer chamber $31_3$ communicate with each other. Then, the wafer W is unloaded from the vacuum processing chamber $40_4$ and loaded into the vacuum transfer chamber $31_3$ by the transfer arm $51_3$ of the wafer transfer mechanism $50_3$.

Next, the gate valve G16 is closed and the gate valve G32 for the temperature control chamber $33_3$ is opened, so that the vacuum transfer chamber $31_3$ and the temperature control chamber $33_3$ communicate with each other. Then, the wafer W is placed on the substrate support 210 in the temperature control chamber $33_3$ that has been pre-heated to a high temperature by the transfer arm $51_3$ of the wafer transfer mechanism $50_3$ and the wafer elevating mechanism 220 in the temperature control chamber $33_3$.

After the wafer W is placed on the substrate support 210, the gate valve G32 is closed and the temperature control chamber $33_3$ is sealed. This state is maintained for a desired period of time. Accordingly, the wafer W is thermally processed at a high temperature, and the film quality is improved.

When the high-temperature heat treatment is completed, the gate valve G32 for the temperature control chamber $33_3$ is opened, and the temperature control chamber $33_3$ and the vacuum transfer chamber $31_3$ communicate with each other. Then, the wafer W is unloaded from the temperature control chamber $33_3$ and loaded into the vacuum transfer chamber $31_3$ by the transfer arm $51_3$ of the wafer transfer mechanism $50_3$.

Then, the wafer W is placed on the substrate support 110 in the intermediate chamber $32_3$ by the transfer arm $51_3$ of the wafer transfer mechanism $50_3$ and the wafer elevating mechanism 120 in the intermediate chamber $32_3$ communicating with the vacuum transfer chamber $31_3$. Accordingly, the temperature of the wafer W is returned to the room temperature. Hence, when the next step is performed, rapid temperature changes of the wafer W can be suppressed and damages to the wafer W or the substrate support can be suppressed.

Thereafter, the wafer W is unloaded from the intermediate chamber $32_3$ and loaded into the vacuum transfer chamber $31_3$ by the transfer arm $51_3$ of the wafer transfer mechanism $50_3$.

Next, the gate valve G17 is opened and the vacuum transfer chamber $31_3$ and the vacuum processing chamber $40_5$ communicate with each other. Then, the wafer W is placed on the substrate support 41 that has been pre-cooled to an extremely low temperature in the vacuum processing chamber $40_5$ by the transfer arm $51_3$ of the wafer transfer mechanism $50_3$ and the wafer elevating mechanism (not shown) in the vacuum processing chamber $40_5$.

After the wafer W is placed on the substrate support 41, the gate valve G17 is closed and the vacuum processing chamber $40_5$ is sealed. Then, film formation is performed on the wafer W in the vacuum processing chamber $40_5$. Accordingly, a CoFeB film is formed as, e.g., a free layer, on the wafer W.

When the processing in the vacuum processing chamber $40_5$ is completed, the gate valve G18 is opened, and the vacuum processing chamber $40_5$ and the vacuum transfer chamber $31_2$ communicate with each other. Then, the wafer W is unloaded from the vacuum processing chamber $40_5$ and loaded into the vacuum transfer chamber $31_2$ by the transfer arm $51_2$ of the wafer transfer mechanism $50_2$.

Next, the gate valve G18 is closed, and the wafer W is placed on the substrate support 110 in the intermediate chamber $32_2$ by the transfer arm $51_2$ of the wafer transfer mechanism $50_2$ and the wafer elevating mechanism 120 in the intermediate chamber $32_2$ communicating with the vacuum transfer chamber $31_2$. Accordingly, the temperature of the wafer W is returned to the room temperature.

Then, the wafer W is unloaded from the intermediate chamber $32_3$ and loaded into the vacuum transfer chamber $31_2$ by the transfer arm $51_2$ of the wafer transfer mechanism $50_2$.

Next, the gate valve G32 for the temperature control chamber $33_2$ is opened, and the vacuum transfer chamber $31_2$ and the temperature control chamber $33_2$ communicate with each other. Then, the wafer W is placed on the substrate support 210 that has been pre-heated to a high temperature in the temperature control chamber $33_2$ by the transfer arm $51_2$ of the wafer transfer mechanism $50_2$ and the wafer elevating mechanism 220 in the temperature control chamber $33_2$.

After the wafer W is placed on the substrate support 210, the gate valve G32 is closed and the temperature control chamber $33_2$ is sealed. This state is maintained for a desired period of time. Accordingly, the wafer W is thermally processed at a high temperature, and the film quality is improved.

When the high-temperature heat treatment is completed, the gate valve G32 for the temperature control chamber $33_2$ is opened, and the temperature control chamber $33_2$ and the vacuum transfer chamber $31_2$ communicate with each other. Then, the wafer W is unloaded from the temperature control chamber $33_2$ and loaded into the vacuum transfer chamber $31_2$ by the transfer arm $51_2$ of the wafer transfer mechanism $50_2$.

Next, the gate valve G31 for the intermediate chamber $32_1$ is opened, and the vacuum transfer chamber $31_2$ and the vacuum transfer chamber $31_1$ communicate with each other through the intermediate chamber $32_1$. Then, the wafer W is unloaded from the vacuum transfer chamber $31_2$ and loaded into the vacuum transfer chamber $31_1$ through the intermediate chamber $32_1$ by the transfer arm $51_2$ of the wafer transfer mechanism $50_2$, the wafer elevating mechanism 120 in the intermediate chamber $32_1$, and the transfer arm $51_1$ of the wafer transfer mechanism $50_1$.

Next, the gate valve G31 is closed and the gate valve G32 for the temperature control chamber $33_1$ is opened, so that the vacuum transfer chamber $31_1$ and the temperature control chamber $33_1$ communicate with each other. Then, the wafer W is placed on the substrate support 210 that has been pre-cooled to a temperature lower than the room temperature in the temperature control chamber $33_1$ by the transfer arm $51_1$ of the wafer transfer mechanism $50_1$ and the wafer elevating mechanism 220 in the temperature control chamber $33_1$.

After the wafer W is placed on the substrate support 210, the gate valve G32 is closed and the temperature control chamber $33_1$ is sealed. This state is maintained for a desired period of time. Accordingly, the wafer W is cooled to a temperature lower than the room temperature, and the film quality can be stabilized.

When the above cooling process is completed, the gate valve G32 for the temperature control chamber $33_1$ is opened, and the temperature control chamber $33_1$ and the vacuum transfer chamber $31_1$ communicate with each other. Then, the wafer W is unloaded from the temperature control chamber $33_1$ and loaded into the vacuum transfer chamber $31_1$ by the transfer arm $51_1$ of the wafer transfer mechanism $50_1$.

Next, the gate valve G32 is closed and the gate valve G20 is opened, so that the vacuum transfer chamber $31_1$ and the vacuum processing chamber $40_6$ communicate with each other. Then, the wafer W is placed on the substrate support 41 having a room temperature in the vacuum processing chamber $40_6$ by the transfer arm $51_1$ of the wafer transfer mechanism $50_1$ and the wafer elevating mechanism (not shown) in the vacuum processing chamber $40_6$.

After the wafer W is placed on the substrate support 41, the gate valve G20 is closed and the vacuum processing chamber $40_6$ is sealed. Then, film formation is performed on the wafer W in the vacuum processing chamber $40_6$. Accordingly, a Ta film or a Ru film is formed as, e.g., a cap layer or an electrode layer, on the wafer W.

When the processing in the vacuum processing chamber $40_6$ is completed, the gate valve G20 is opened, and the vacuum processing chamber $40_6$ and the vacuum transfer chamber $31_1$ communicate with each other. Then, the wafer W is unloaded from the vacuum processing chamber $40_6$ and loaded into the vacuum transfer chamber $31_1$ by the transfer arm $51_1$ of the wafer transfer mechanism $50_1$.

Thereafter, the wafer W is returned to the original cassette C through the load-lock chamber 13 in the reverse order of the operation of loading the wafer W from the cassette C.

In some cases, the cooling process in the temperature control chamber $33_1$ may not be necessary. In such a case, the wafer W may be transferred to the vacuum processing chamber $40_6$ through the gate valve G19 without passing through the intermediate chamber $32_1$ or the like.

As described above, in the present embodiment, the vacuum transfer apparatus 30 for transferring the wafer W includes the plurality of vacuum transfer chambers 31, each having therein the wafer transfer mechanism 50 for holding and transferring the wafer W, and the intermediate chamber 32 disposed between the adjacent vacuum transfer chambers 31. Further, when one of the vacuum transfer chambers 31 adjacent to each other is set as the first vacuum transfer chamber 31 and the other is set as the second vacuum transfer chamber 31, the first wafer loading/unloading port 101 is provided between the intermediate chamber 32 and the first vacuum transfer chamber 31 and the second wafer loading/unloading port 102 is provided between the intermediate chamber 32 and the second vacuum transfer chamber 31. The gate valve G31 is provided only for the second wafer loading/unloading port 102 between the first wafer loading/unloading port 101 and the second wafer loading/unloading port 102. Therefore, compared to the case where the gate valves are disposed at both of the first wafer loading/unloading port 101 and the second wafer loading/unloading port 102, the footprint in the connecting direction that the vacuum transfer chambers of the vacuum transfer apparatus 30 are connected, i.e., the footprint in the apparatus depth direction, can be reduced, which makes it possible to scale down the vacuum transfer apparatus 30. Further, in the present embodiment, the first wafer loading/unloading port 101 and the second wafer loading/unloading port 102 have different height positions, so that the following structure can be employed and the footprint of the vacuum transfer apparatus 30 can be further reduced. For example, it is possible to employ the structure in which the temperature control chamber 33 is disposed adjacent to the intermediate chamber 32 in the apparatus width direction; the third wafer loading/unloading port 201 whose height position is different from that of the first wafer loading/unloading port 101 is disposed only between the first vacuum transfer chamber 31 and the temperature control chamber 33, not between the second vacuum transfer chamber 31 and the temperature control chamber 33; and the gate valve G32 is disposed at the third wafer loading/unloading port 201.

In the case of employing such a structure, when it is necessary to provide the gate valve G32 for the temperature control chamber 33 disposed adjacent to the intermediate chamber 32 in the apparatus width direction, the loading/unloading of the wafer W through the first wafer loading/unloading port 101 is not disturbed by the gate valve G32. Particularly, even if the gate valve G32 is close to the first wafer loading/unloading port 10 in the apparatus width direction, the loading/unloading of the wafer W through the first wafer loading/unloading port 101 is not disturbed by the gate valve G32. Therefore, by employing the above structure, the distance between the intermediate chamber 32 and the temperature control chamber 33 in the apparatus width direction can be shortened by reducing the distance in the apparatus width direction between the first wafer loading/unloading port 101 and the gate valve G32 (i.e., the third wafer loading/unloading port 201 provided with the gate valve G32). Accordingly, the footprint of the vacuum transfer apparatus 30 can be reduced. Since the distance between the intermediate chamber 32 and the temperature control chamber 33 in the apparatus width direction can be shortened as described, the vacuum processing chambers 40 can be arranged closer to the center of the apparatus width direction. Therefore, it is possible to further reduce the footprint in the apparatus width direction of the processing system 1 including the vacuum transfer apparatus 30 of the present embodiment to thereby scale down the processing system 1.

Further, in the present embodiment, the gate valve G32 and the first wafer loading/unloading port 101 are arranged to be partially overlapped with each other in the apparatus width direction in a plan view. With this structure, the distance between the intermediate chamber 32 and the temperature control chamber 33 in the apparatus width direction can be further reduced, so that the footprint of the vacuum transfer apparatus 30 can be further reduced.

The wafer loading/unloading port provided for the temperature control chamber 33 is provided for only one of the two vacuum transfer chambers 31 adjacent to the temperature control chamber 33. Accordingly, the number of gate valves can be reduced, and thus the footprint of the vacuum transfer apparatus 30 can be reduced.

Further, in the present embodiment, the gate valves G31 and G32 are disposed at the upper portion of the vacuum transfer apparatus 30.

A driving unit (not shown) for the wafer transfer mechanism 50 is disposed at the lower portion of the vacuum transfer apparatus 30. Therefore, when the gate valves G31 and G32 are disposed at the lower portion of the vacuum transfer apparatus 30, it is required to increase the footprint to prevent the driving of the gate valves G31 and G32 from being disturbed by the driving unit. Further, it is difficult to perform the maintenance of the gate valves G31 and G32.

Such a problem can be solved by arranging the gate valves G31 and G32 at the upper portion of the vacuum transfer apparatus 30.

In the present embodiment, due to the presence of the temperature control chamber 33 and the intermediate chamber 32 having the substrate support 110 capable of controlling the temperature of the wafer W, the wafer W can be pre-heated and pre-cooled in the temperature control chamber 33 and the intermediate chamber 32. Therefore, the processing time in each vacuum processing chamber 40 can be reduced. Accordingly, the productivity can be improved.

Conventionally, a module having a structure similar to that of the vacuum processing chamber 40, which is dedicated to pre-heating or pre-cooling, was used. The processing system 1 including the vacuum transfer apparatus 30 of the present embodiment does not require such a module, so that the footprint of the processing system 1 can be reduced compared to the conventional case.

Further, since the wafer W can be pre-heated or pre-cooled, the temperature difference between the substrate support 41 of the vacuum processing chamber 40 and the wafer W placed on the substrate support 41 can be reduced. Therefore, damage to the wafer W and the substrate support 41 which can be caused by the temperature difference can be reduced.

In the processing system 1 having the vacuum transfer apparatus 30 of the present embodiment, the vacuum processing chambers $40_1$ to $40_6$ are arranged in a U shape and can be used in that order. Further, one wafer W is not transferred to the same vacuum processing chamber 40 multiple times. In other words, the wafer W can be transferred without revisiting the same vacuum processing chamber 40. The same vacuum processing chamber 40 may be used multiple times to perform the above-described pre-heating or the like; however, the productivity deteriorates. On the other hand, in the present embodiment, since the wafer W can be transferred without revisiting the same vacuum processing chamber 40, the productivity does not deteriorate even if the pre-heating or the like is performed.

In the above description, the temperature control chamber 33 is arranged adjacent to the intermediate chamber 32 in the apparatus width direction. However, instead of the temperature control chamber 33, another intermediate chamber may be arranged adjacent to the intermediate chamber 32. In other words, the intermediate chambers may be arranged in the apparatus width direction. In this case, the gate valves for both of the intermediate chambers are disposed at diagonally opposite positions in the apparatus depth direction.

Although the film formation has been described as an example in the above embodiment, the substrate transfer apparatus of the present embodiment can be applied to another process such as etching or the like instead of the film formation or in addition to the film formation.

The presently disclosed embodiments of the present disclosure are considered in all respects to be illustrative and not restrictive. The above-described embodiments can be embodied in various forms. Further, the above-described embodiments may be omitted, replaced, or changed in various forms without departing from the scope of the appended claims and the gist thereof.

The following configurations are also included in the technical scope of the present disclosure.

(1) A substrate transfer apparatus for transferring a substrate includes: a plurality of vacuum transfer chambers, each having therein a substrate transfer mechanism for holding and transferring the substrate; and an intermediate chamber disposed between the vacuum transfer chambers adjacent to each other. When one of the vacuum transfer chambers adjacent to each other is set as a first vacuum transfer chamber and the other is set as a second vacuum transfer chamber, a first substrate loading/unloading port is disposed between the intermediate chamber and the first vacuum transfer chamber and a second substrate loading/unloading port is disposed between the intermediate chamber and the second vacuum transfer chamber. Further, a gate valve is provided for the second substrate loading/unloading port between the first substrate loading/unloading port and the second substrate loading/unloading port, and the first substrate loading/unloading port and the second substrate loading/unloading port have different height positions.

In accordance with the configuration (1), the footprint of the substrate transfer apparatus in the connecting direction that the vacuum transfer chambers are connected can be reduced, so that the substrate transfer apparatus can be scaled down. Further, since the first substrate loading/unloading port and the second substrate loading/unloading port have different height positions, it is possible to employ a structure capable of further reducing the footprint of the substrate transfer apparatus.

(2) The substrate transfer apparatus of the configuration (1) further includes a temperature control chamber that is disposed at a position adjacent to the intermediate chamber between the vacuum transfer chambers adjacent to each other to control a temperature of the substrate, and a third substrate loading/unloading port is disposed between the temperature control chamber and only one of the first vacuum transfer chamber and the second vacuum transfer chamber.

(3) In the substrate transfer apparatus of the configuration (2), a gate valve is disposed at the third substrate loading/unloading port.

(4) In the substrate transfer apparatus of the configuration (3), the third substrate loading/unloading port is disposed between the first vacuum transfer chamber and the temperature control chamber, and a height position of the third substrate loading/unloading port is different from a height position of the first substrate loading/unloading port.

In accordance with the configuration (4), the footprint of the substrate transfer apparatus and the footprint of the processing system including the substrate transfer apparatus can be further reduced.

(5) In the substrate transfer apparatus of any one of the configurations (1) to (4), the intermediate chamber includes a substrate support that controls a temperature of the substrate placed thereon.

(6) In the substrate transfer apparatus of any one of the configurations (1) to (5), the gate valve is disposed at an upper portion of the substrate transfer apparatus.

(7) A substrate transfer method using the substrate transfer apparatus of any one of the configurations (1) to (6) is provided.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made departing from the spirit of the disclosures. The accompanying claims and their equivalents are intended to cover such forms or modifications as would fall within the scope and spirit of the disclosures.

The invention claimed is:

1. A substrate transfer apparatus for transferring a substrate, comprising:

a plurality of vacuum transfer chambers, each having therein a substrate transfer mechanism for holding and transferring the substrate;

an intermediate chamber disposed between the vacuum transfer chambers adjacent to each other; and a temperature control chamber that is disposed at a position adjacent to the intermediate chamber between the vacuum transfer chambers adjacent to each other to control a temperature of the substrate, wherein when one of the vacuum transfer chambers adjacent to each other is set as a first vacuum transfer chamber and the other is set as a second vacuum transfer chamber, the first vacuum transfer chamber, the second vacuum transfer chamber, the intermediate chamber and the temperature control chamber are disposed on the same horizontal plane, a first substrate loading/unloading port is disposed between the intermediate chamber and the first vacuum transfer chamber and a second substrate loading/unloading port is disposed between the intermediate chamber and the second vacuum transfer chamber, a gate valve is provided for the second substrate loading/unloading port between the first substrate loading/unloading port and the second substrate loading/unloading port, and the first substrate loading/unloading port and the second substrate loading/unloading port have different height positions, wherein when the gate valve is opened, the first vacuum transfer chamber and the second vacuum transfer chamber communicate with each other through the intermediate chamber, wherein a third substrate loading/unloading port is disposed between the temperature control chamber and only one of the first vacuum transfer chamber and the second vacuum transfer chamber, a further gate valve is disposed at the third substrate loading/unloading port, and the third substrate loading/unloading port is disposed between the first vacuum transfer chamber and the temperature control chamber, and a height position of the third substrate loading/unloading port is different from a height position of the first substrate loading/unloading port.

2. The substrate transfer apparatus of claim 1, wherein the intermediate chamber includes a substrate support that controls a temperature of the substrate placed thereon.

3. The substrate transfer apparatus of claim 2, wherein the gate valve is disposed at an upper portion of the substrate transfer apparatus.

4. The substrate transfer apparatus of claim 1, wherein the gate valve is disposed at an upper portion of the substrate transfer apparatus.

5. A substrate transfer method using the substrate transfer apparatus described in claim 1.

* * * * *